United States Patent
Washkurak

(10) Patent No.: US 8,072,364 B2
(45) Date of Patent: Dec. 6, 2011

(54) AVOIDING FLOATING DIFFUSION CONTAMINATION

(75) Inventor: William D. Washkurak, Acton, MA (US)

(73) Assignee: Kenet, Inc., Woburn, MA (US)

( * ) Notice: Subject to any disclaimer, the term of this patent is extended or adjusted under 35 U.S.C. 154(b) by 0 days.

(21) Appl. No.: 12/330,215

(22) Filed: Dec. 8, 2008

(65) Prior Publication Data
US 2009/0179672 A1    Jul. 16, 2009

Related U.S. Application Data

(60) Provisional application No. 61/005,773, filed on Dec. 7, 2007.

(51) Int. Cl.
*H03M 1/12* (2006.01)

(52) U.S. Cl. .......................... 341/172; 341/155

(58) Field of Classification Search .......... 341/172, 341/155, 166, 161, 120, 118
See application file for complete search history.

(56) References Cited

U.S. PATENT DOCUMENTS

| | | | | |
|---|---|---|---|---|
| 4,375,059 A | * | 2/1983 | Schlig | 341/162 |
| 4,659,928 A | | 4/1987 | Tew | |
| 5,877,715 A | | 3/1999 | Gowda et al. | |
| 5,942,780 A | * | 8/1999 | Barsan et al. | 257/321 |
| 6,756,929 B1 | * | 6/2004 | Ali | 341/161 |
| 6,831,486 B1 | | 12/2004 | Hynecek | |
| 6,852,591 B2 | | 2/2005 | Rhodes | |
| 6,917,041 B2 | | 7/2005 | Doty et al. | |
| 7,319,425 B2 | * | 1/2008 | Fiorenza et al. | 341/172 |
| 2002/0166949 A1 | | 11/2002 | Machida | |

OTHER PUBLICATIONS

Fossum, E.R., "CMOS Image Sensors: Electronic Camera-on-a-Chip," *IEEE Transactions on Electron Devices* 44(10):1689-1698 (1997).

Karvonen, S., et al., "A CMOS Quadrature Charge-domain Sampling Circuit with 66-dB SFDR up to 100 MHz," *IEEE Transactions on Circuits and Systems I: Regular Papers* 52(2):292-304 (2005).

International Search Report and Written Opinion of the International Searching Authority from International Application No. PCT/US2008/013474, Date Mailed: Jul. 30, 2009.

International Preliminary Report on Patentability from International Application No. PCT/US2008/013474, Date Mailed: Jun. 17, 2010.

Supplementary European Search Report, European Patent Application 08859824.8; Date of Mailing Feb. 11, 2011; 6 pages.

* cited by examiner

*Primary Examiner* — Joseph Lauture
(74) *Attorney, Agent, or Firm* — Hamilton, Brook, Smith & Reynolds, P.C.

(57) ABSTRACT

A technique for operating a source follower buffer circuit, such as employed in a charge domain pipeline, to eliminate floating diffusion signal charge contamination from downstream circuits. The method and apparatus places an output of the circuit in a known state immediately prior to charge transfer into a floating diffusion, and again in known state immediately prior to charge transfer out of the floating diffusion.

27 Claims, 5 Drawing Sheets

US 8,072,364 B2

AVOIDING FLOATING DIFFUSION CONTAMINATION

RELATED APPLICATION(S)

This application claims the benefit of U.S. Provisional Application No. 61/005,773, filed on Dec. 7, 2007. The entire teachings of the above application(s) are incorporated herein by reference.

BACKGROUND OF THE INVENTION

In charge domain pipeline circuits, such as used in Analog to Digital Converters (ADCs) and other applications, signal charge is transferred from a sending capacitive net to a pre-charged receiving capacitive net using a charge transfer device. These capacitive nets are typically implemented as floating diffusions. Transfer of a signal charge into a capacitive net causes the voltage on the capacitive net to drop from a pre-charged voltage by an amount proportional to the amount of charge.

In order to measure the size of the signal charge, as needed for the purpose of comparing it to another charge packet on an opposing floating diffusion of a differential design, it is necessary to either amplify or buffer the change in voltage. This is normally done by connecting the Floating Diffusion (FD) to the gate of a Metal Oxide Semiconductor Field Effect Transistor (MOSFET) which acts as an input device to a buffer circuit.

After the change in voltage has been measured, the received charge packet is sent to the next receiving floating diffusion in the pipeline. This charge packet should be completely transferred without losing any charge to the gate of the buffer/amplifier input device. Unfortunately, this is difficult due to the charging of the parasitic capacitance of these input devices with some of the signal charge. Opposite sides of these parasitic capacitors are connected to internal nets of the amplifier/buffer circuitry and, thus the amount of coupling from these nets back onto the floating diffusion is un-deterministic.

SUMMARY OF THE INVENTION

In a preferred embodiment, a charge packet present in a floating diffusion charge pipeline is sensed by a Source Follower Buffer (SFB) circuit. The SFB circuit is placed in a known state just prior to charge transfer onto a floating diffusion and is returned a known state just prior to transfer of a charge off of the floating diffusion.

The known state in the SFB circuit may be imposed by using a Metal Oxide Semiconductor Field Effect Transistor (MOSFET) controlled by a clock signal. In one embodiment, the clock signal is arrange to hold the output of the SFB circuit in a known high state prior to charge transfer onto the floating diffusion, released while charge is transferred onto the floating diffusion, and then held in a high state again prior to and during charge transfer off of the floating diffusion. Such an arrangement not only provides the desired states for the MOSFET, but also places it in a deep depletion mode to minimize its capacitance contribution to the net.

In still further alternate embodiments, a current source may improve current flow while the MOSFET is pulling the output of the SFB circuit to the known state.

By holding the floating diffusion in an initial state during a pre-charge mode (e.g., just after pre-charge and prior to charge transfer), releasing it during a charge transfer in mode, but then returning it to the same initial state prior to charge transfer out of the floating diffusion, one can reduce and/or eliminate the influence of follow on circuits on the amount of charge transferred out of the floating diffusion.

Furthermore, by providing a switch coupled to the current source, one can reduce the total power consumption as well.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of example embodiments of the invention follows.

Figure 1:
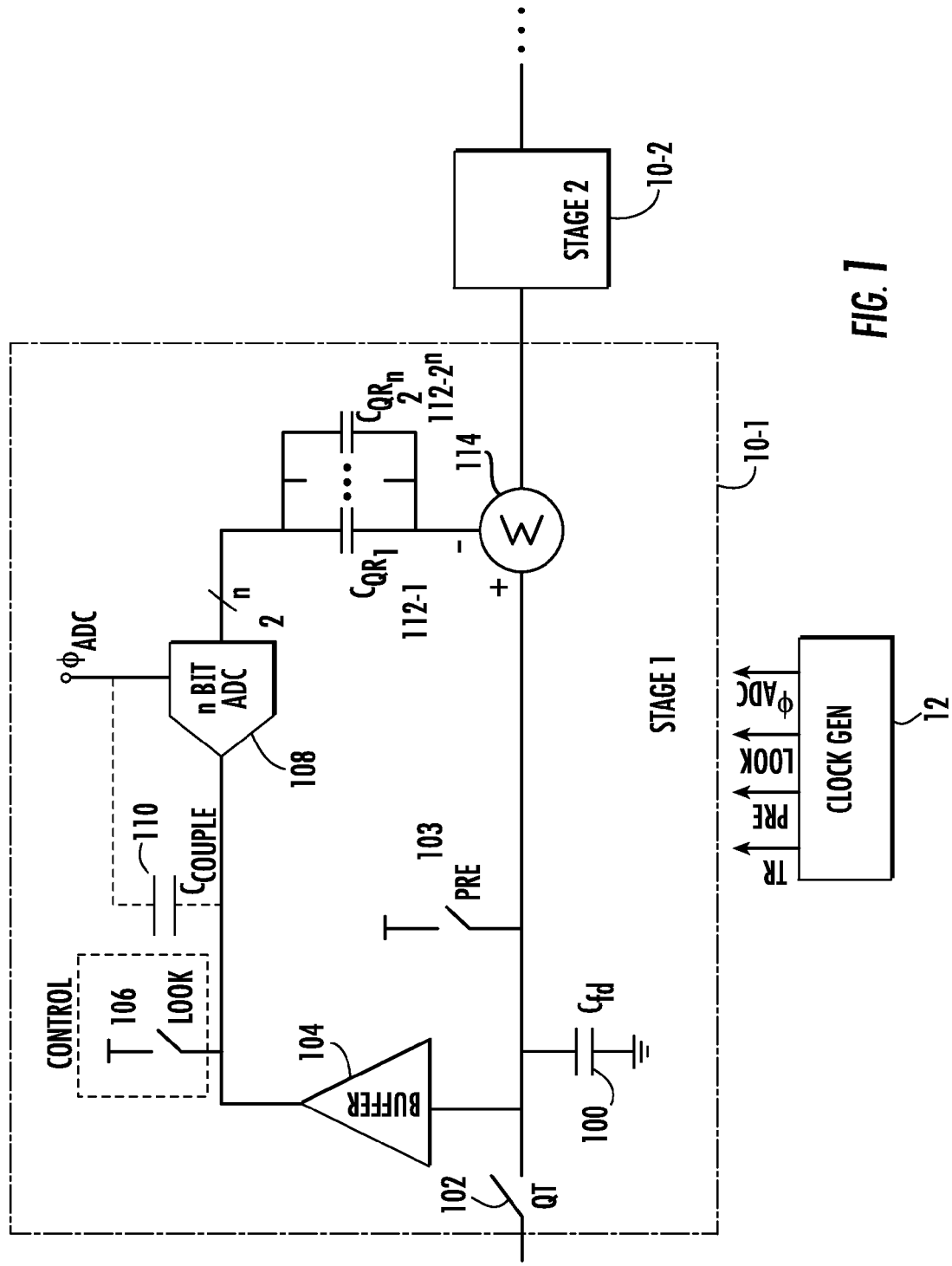
FIG. 1 is a high level block diagram of a charge pipeline circuit.

FIG. 1 is a high level block diagram of a charge pipeline circuit. The specific circuit shown is an Analog to Digital converter (ADC) function comprised of a number of stages 10-1, 10-2, . . . . An example stage 10-1 consists of a floating diffusion represented by capacitor 100 (Cfd), a charge transfer input circuit 102, a floating diffusion (FD) pre-charge circuit 103, and a charge output circuit 114. In operation, the pre-charge circuit 103 sets an initial state (voltage) for diffusion 100. An input signal charge (QT) is then fed to the floating diffusion 100 by input circuit 102. A clock signal generator 12 provides the various signals necessary to operate the stages 10 such as an input transfer signal (TR) that controls input circuit 102, a pre-charge signal (PRE) that controls precharge 103, and other signals.

Introduction of this charge to the floating diffusion causes the voltage thereon to change. In order to implement an application circuit such as an analog to digital converter, the amount of voltage on the floating diffusion 100 must be measured and compared to one or more reference voltages. For this purpose, a buffer circuit 104 such as may be a Source Follower Buffer (SFB) senses charge on floating diffusion 100 and feeds it to an ADC stage 108. The n-bit ADC stage 108 may be composed of a 1 bit, 1½ bit, 2 bits or more providing a number of output bits, $2^n$. ADC stage 108 typically consists of a number of reference voltages and comparators to provide demultiplexed output bits. For example, if the ADC stage 108 is a 2-bit converter, then there are 4 outputs. A parasitic capacitance represented by Ccouple 110 feeds change back from ADC 108 to SFB 104.

The $2^n$ outputs from ADC stage 108 are then fed to corresponding ones of charge redistribution capacitors 112-1, 112-$2^n$ (Cqr1, . . . Cqr$2^n$). These capacitors collectively provide an amount of charge to be reintroduced to the pipeline, which is then fed to the input of the differential amplifier 114, producing the output charge from stage 10-1.

Figure 2:
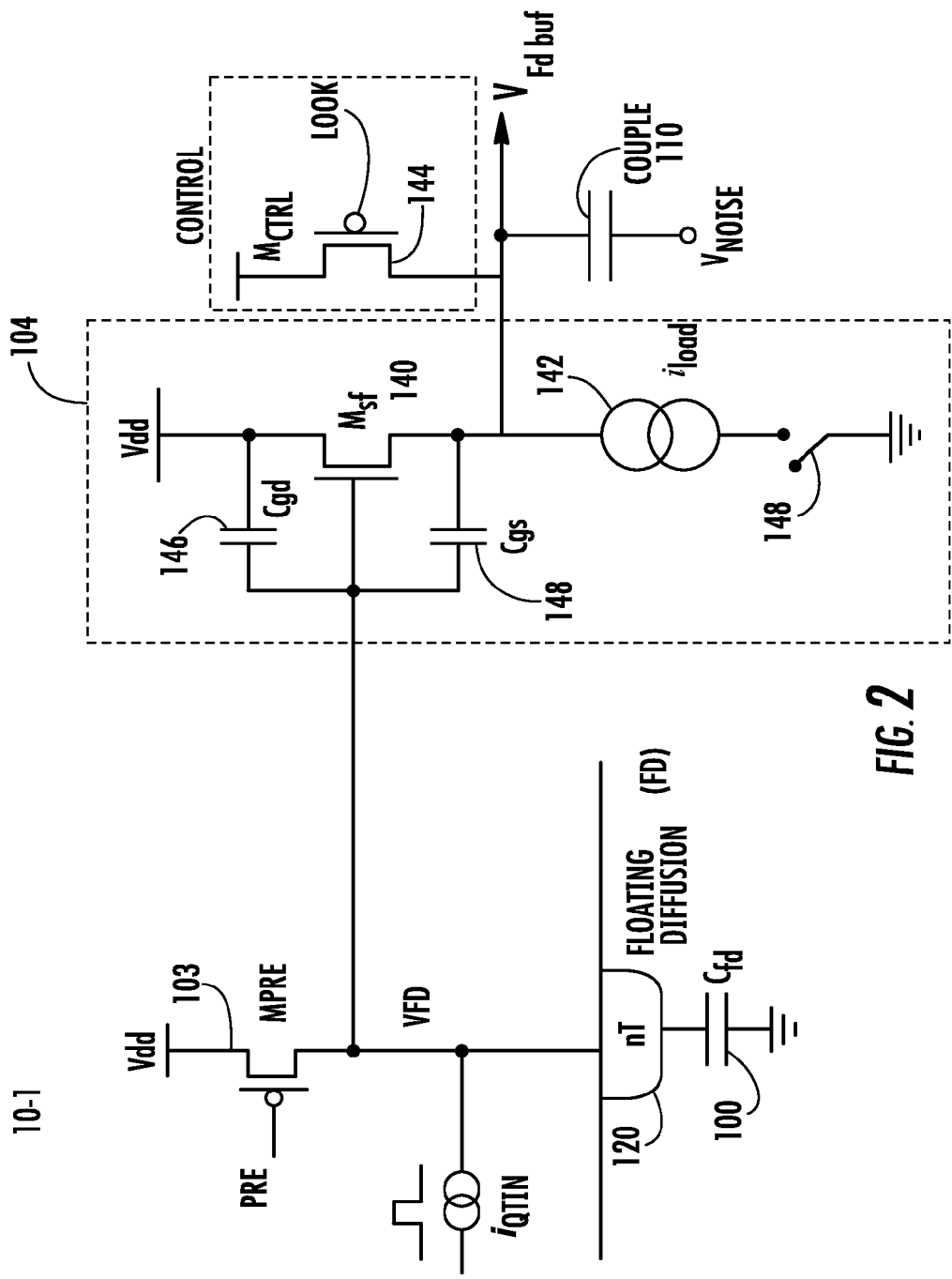
FIG. 2 is a circuit diagram of a Source Follower Buffer (SFB) circuit.

FIG. 2 shows the Source Follower Buffer (SFB) circuit 104 and its interaction with elements of the stage 10-1 in more detail. Carried forward from FIG. 1 are the capacitance 100 representing floating diffusion 120 (FD) with an input charge provided by input current source $i_{QTIN}$. The pre-charge circuit provided by $M_{PRE}$ provides pre-charging of the floating diffusion 120.

The source follower buffer (SFB) circuit 104 is shown to more particularly include an N-channel device ($M_{SF}$), a load represented by current source 142 ($i_{load}$), and P-channel device ($M_{CTRL}$). The P channel device is controlled by the LOOK signal which is generated by the clock signal generator previously referenced.

Here, Cdg 146 and Cgs 148 parasitics are also shown. The Cgs parasitic capacitances include both channel and overlap capacitance. An additional capacitor 110 (Ccouple), represents coupling from follow on circuitry. Such coupling circuitry may, for example, be a cross-coupled latch that can kick back and contaminate the signal charge on the floating diffusion 120 (FD).

Referring to the timing diagram of FIG. 3, the floating diffusion voltage (Vfd) sequence is as follows:

by t1, the pre-charge FET 103 (MPRE) pulls the FD 120 to Vdd;

at t2, the pre-charge FET 103 (MPRE) turns off resulting in a positive going feedthrough;

during $i_{QTIN}$, a signal charge packet (e.g. Qt) is transferred onto the FD 120 causing its voltage to drop by an amount proportional to the size of the packet;

by t3, charge transfer is complete;

at t4, a voltage disturbance on the other side of Ccouple 110 has coupled back onto the FD; and at t5, the signal charge is transferred out of the FD 120 by using charge extraction circuitry that brings Vfd to a fixed Vfdss level.

Figure 3:
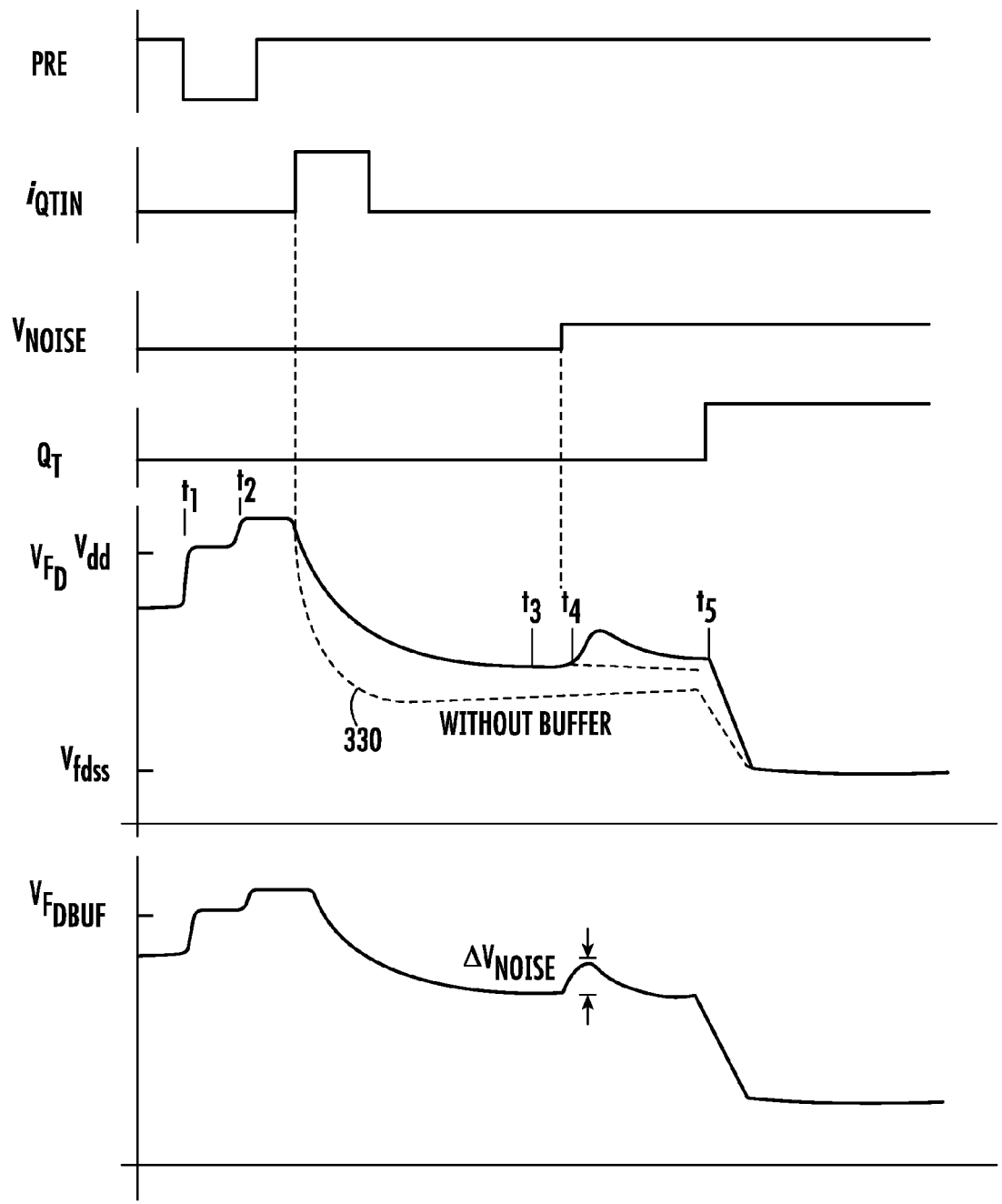
FIGS. 3 and 4 are timing diagrams for the circuit of FIG. 2.

The dashed horizontal line 330 in FIG. 3 shows how Vfd would behave with the SFB 104 removed; the other trace 340 shows the effect of SFB 104. The difference between these two traces illustrate the effects of the parasitic capacitors of the SFB 104. The change (delta Vfd) is due the load capacitance presented to the FD 120 by the buffer 104. The longer time constant "droop" after the signal charge has been dumped onto the FD 120 is due to the slow settling of the SFB 104 output coupling back to the FD 120 through Cgs 148. The output of the SFB, Vfdbuf, is seen to follow the FD 120 with a limited bandwidth.

Interferer noise, Vnoise, also couples onto Vfd through Ccouple 110 and Cgs 148. If the effect of Vnoise has not settled adequately before charge transfer off of the FD 120, an error in the amount of signal charge transferred results.

In a preferred embodiments, the invention controls the output of the SFB 104 by putting it in a known state at two points in time; just prior to charge transfer onto the FD 120 and just prior to charge transfer off of the FD 120. By holding the FD 120 in an initial state during pre-charge, just after pre-charge and prior to charge transfer, and then returning it to that same initial state prior to transfer of charge out of FD 120 eliminates the influence of follow-on circuit net voltage changes on the amount of charge transferred from the FD 120.

Figure 4:
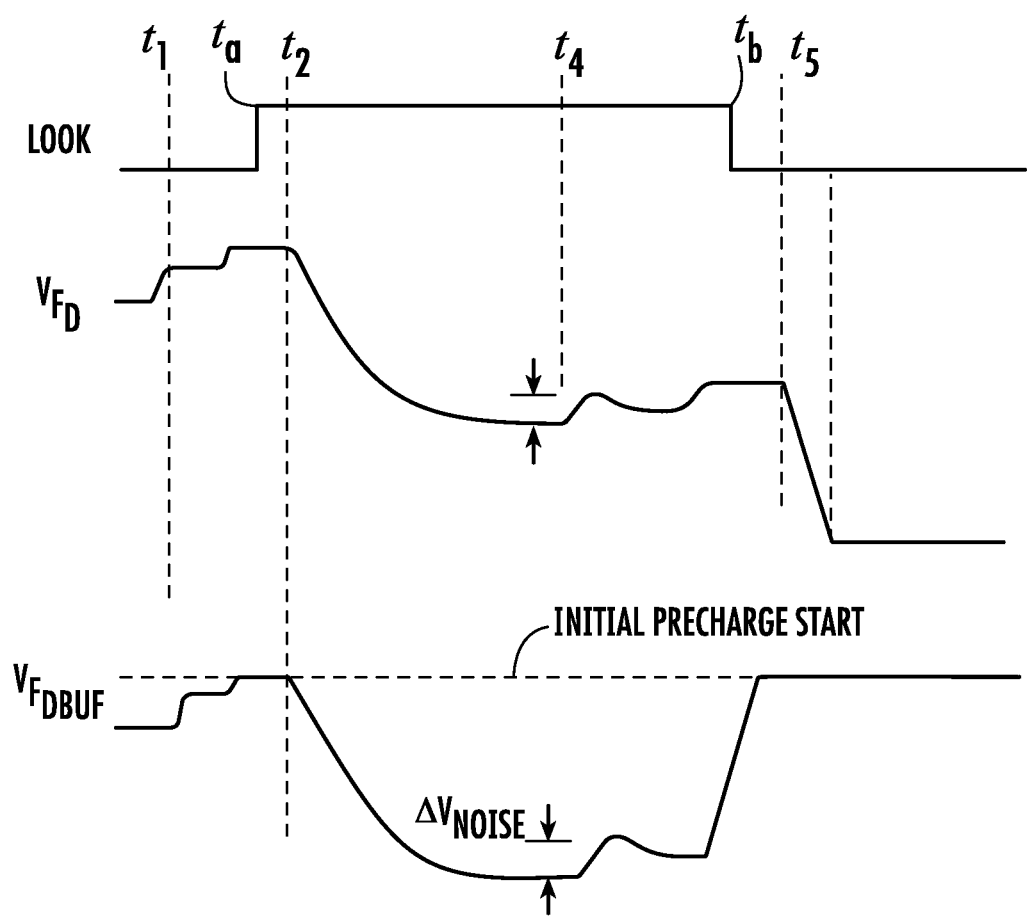

With reference to FIG. 4 and the implementation illustrated in FIG. 2, the P-channel device Mctrl is clocked by LOOK so that the output of the SFB 104 is held high prior to charge transfer onto the FD 120, released while charge is transferred onto the FD 120, and then held high again prior and during charge transfer off of the FD 120. This has the added benefit that the Msf 140 inversion channel is eliminated, reducing the capacitance of the floating diffusion, reducing kTC noise.

In preferred embodiments, the current source 142 load is controlled with the switch 148 in synchronization with Mctrl. By also switching off the current source 142 in this state, one can reduce overall power consumption. The current source 142 may be implemented as an active current source or also may be a resistor.

The LOOK signal bus controls the operation of the source follower buffer circuit. In particular, the LOOK signal ensure that the output of the SFB 104 is held until a point in time, $t_a$, that occurs between times t1 and t2. It is then released the floating diffusion until time, $t_b$, that occurs between times t4 and t5 when the output of the SFB 104 will again return to a known state.

Figure 5:
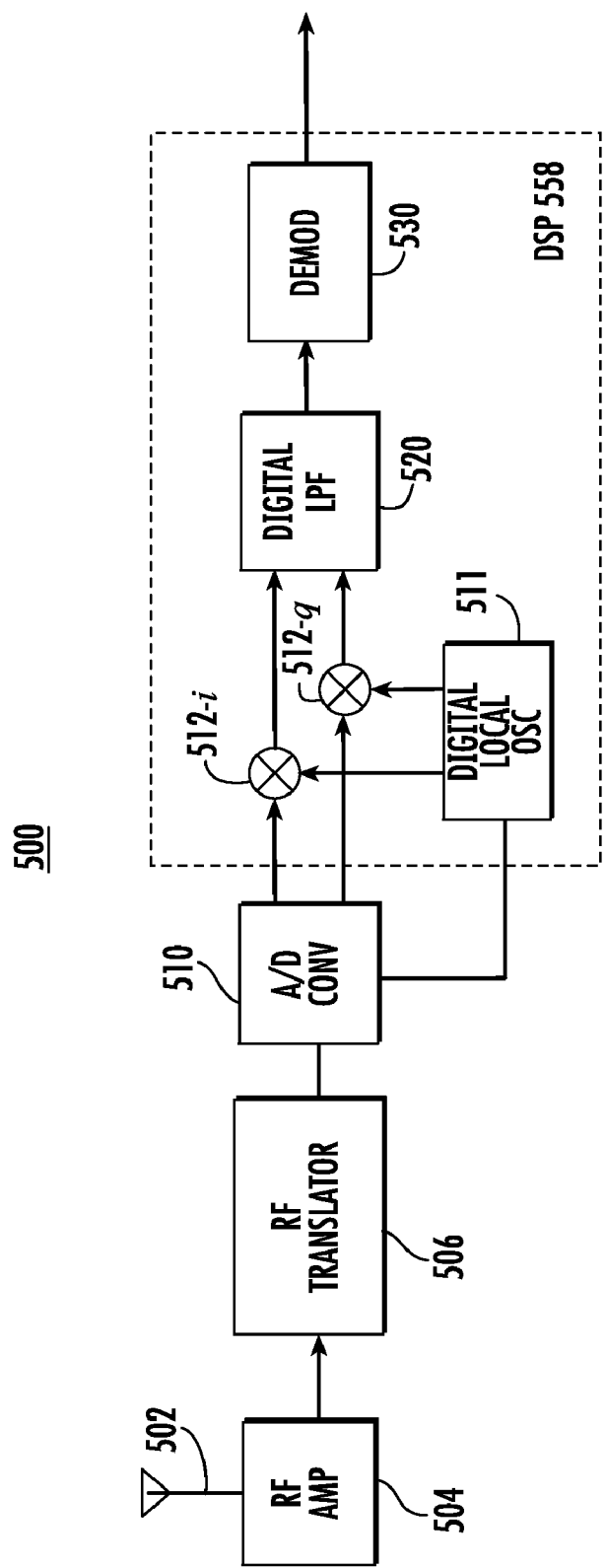
FIG. 5 is a block diagram of a digital radio receiver that may utilize the SFB circuit.

One particular use of the SFB 104 is to implement a digital radio receiver as generally shown in FIG. 5. A radio frequency (RF) signal is fed to a radio frequency RF amplifier 504. In a wireless application, the RF signal may be received from an antenna 502; in other applications it may be received via a wire. The amplified RF signal is then fed to an RF translator 506 to down-convert the amplified RF signal to an intermediate frequency (IF). After the RF translator 506 (which may be optional) the ADC 510 is then used to digitize the RF input into digital samples for subsequent processing. A digital local oscillator 511 may operate digital mixers 512-$i$ and 512-$q$ to provide for in phase and quadrature samples thereof. A digital low pass filter 520 limits the frequency content of resulting signal to the desired bandwidth. A demodulator 530 then recovers the original modulated signal from the same using. One or more of the operations of the digital local oscillator 511, mixers 512, low pass filter 520 and/or demodulator 530 may be implemented in a digital signal processor 550. The recovered signal may then be further processed converted back to an analog baseband signal or the like, depending on the specific end application of the digital receiver.

While this invention has been particularly shown and described with references to example embodiments thereof, it will be understood by those skilled in the art that various changes in form and details may be made therein without departing from the scope of the invention encompassed by the appended claims.

What is claimed is:

1. A method for operating a floating diffusion as a charge storage node comprising:
   (a) coupling an input of a buffer circuit to the charge storage node;
   (b) coupling an output of the buffer circuit to a first known high voltage;
   (c) transferring a signal charge onto the charge storage node subsequent to step (b), such that the output of the buffer circuit is coupled to the first known high voltage state prior to transferring signal charge onto the charge storage node;
   (d) subsequent to step (c), coupling the output of the buffer circuit to a second known high voltage, the second known voltage being independent of the signal charge; and
   (e) transferring the signal charge off of the charge storage node subsequent to step (d), such that the output of the buffer circuit is returned to the second known high voltage state prior to transferring the signal charge off of the charge storage node.

2. The method of claim 1 wherein the floating diffusion is part of a network of floating diffusions in a charge transfer pipeline.

3. The method of claim 2 wherein the charge transfer pipeline implements an analog to digital converter.

4. The method of claim 3 wherein the analog to digital converter is part of a digital radio frequency receiver.

5. The method of claim 1 wherein the first and second known high voltages are the same predetermined voltage.

6. The method of claim 5 further comprising:
providing the first and second known voltages via a MOSFET.

7. The method of claim 6 wherein the MOSFET is placed in a deep depletion mode.

8. The method of claim 7 additionally comprising:
(f) operating a further switch to control a current source load coupled to the MOSFET.

9. The method of claim 8 additionally comprising:
turning off the current source while the MOSFET is pulled to the known high voltage.

10. A method for operating a charge domain pipeline comprising a network of floating diffusions coupled to corresponding buffer circuits, the method comprising:
forcing an output of at least one buffer circuit to a known high voltage prior to charge transfer onto the network of floating diffusions;
permitting the buffer circuit to couple to an input charge, and thereby to follow a corresponding floating diffusion; and
forcing the output of the buffer circuit back to the known high voltage prior to charge transfer off of the corresponding floating diffusion, the known high voltage being independent of the input charge.

11. An apparatus comprising:
a charge storage node comprising a floating diffusion;
a charge transfer circuit, for transferring charge onto and off of the charge storage node;
a buffer circuit having an input coupled to the charge storage node; and
a control circuit, for coupling an output of the buffer circuit to a known high voltage state prior to transferring charge onto the charge storage node, and returning the output of the buffer circuit to the known high voltage state prior to charge transfer off of the charge storage node.

12. The apparatus of claim 11 wherein the floating diffusion is part of a network of floating diffusions in a charge transfer pipeline.

13. The apparatus of claim 12 wherein the charge transfer pipeline implements an analog to digital converter.

14. The apparatus of claim 13 wherein the analog to digital converter is part of a digital radio frequency receiver.

15. The apparatus of claim 11 wherein the control circuit additionally comprises:
a switch coupled to control the known high voltage state of the buffer circuit.

16. The apparatus of claim 15 wherein the switch is a MOSFET is placed in a deep depletion mode during the known high voltage state.

17. The apparatus of claim 16 additionally comprising:
a switch, arranged to control a current source that is coupled to the MOSFET, to further cut off the current flow through the MOSFET in the known high voltage state.

18. A charge domain pipeline apparatus comprising:
a network of floating diffusions;
a plurality of buffer circuits coupled to the network of floating diffusions; and
a control circuit, for forcing an output of at least one buffer circuit to a known high voltage prior to transferring charge into at least one of the floating diffusions, for permitting the buffer circuit to follow the floating diffusion state after charge is transferred into the floating diffusion, and for forcing the output of the buffer circuit back to the known high voltage state after charge transfer and the floating diffusion, but prior to charge transfer out of the floating diffusion.

19. An Analog to Digital Converter (ADC) apparatus comprising:
a charge storage node comprising a floating diffusion, connected to receive an ADC input signal charge;
a charge transfer input circuit, for transferring charge onto and off of the charge storage node;
a source follower buffer circuit having an input coupled to the charge storage node and providing a source follower buffer output;
an ADC stage circuit, connect to the source follower buffer output, and to provide a plurality of ADC stage outputs;
a charge redistribution circuit, connect to the ADC stage outputs to provide a redistribution signal;
a differential amplifier, connected receive the charge storage node and the redistribution signal, and to provide an ADC output signal charge; and
a control circuit, for coupling an output of the source follower buffer circuit to a known high voltage state prior to the charge transfer circuit transferring charge onto the charge storage node, and returning the output of the source follower buffer circuit to the known high voltage state prior to the charge transfer circuit transferring charge off of the charge storage node.

20. The apparatus of claim 19 wherein the floating diffusion is part of a network of floating diffusions providing a charge transfer pipeline ADC.

21. The apparatus of claim 19 wherein the control circuit comprises:
a first switch coupled between the input of the source follower buffer circuit and a known voltage reference; and
a second switch disposed between the output of the source follower buffer circuits and another known voltage reference.

22. The apparatus of claim 19 wherein the ADC stage provides a selected one of a single bit, one-and-one-half bits, or two bits of output resolution.

23. The apparatus of claim 19 wherein the charge redistribution circuit comprises a plurality of capacitors disposed in parallel between two or more outputs of the ADC stage and an input of the differential amplifier.

24. A method for operating a charge domain pipeline as an Analog to Digital Converter (ADC), the charge domain pipeline comprising a network of floating diffusions coupled to corresponding buffer circuits, the method comprising:
forcing an output of a selected buffer circuit to a known high voltage prior to charge transfer onto a selected floating diffusion in the network of floating diffusions;
coupling the selected floating diffusion to an input analog signal charge, and thereby permitting the selected buffer circuit to follow the floating diffusion;
coupling an output of the selected buffer circuit to an ADC stage, to provide one or more ADC stage output signals;
generating a redistribution charge from at least one ADC stage output signal;
determining a difference between the redistribution charge and the input analog signal charge, to produce an output charge to be fed to another one of the floating diffusions; and
forcing the output of the selected buffer circuit back to the known high voltage prior to charge transfer off of the selected floating diffusion, the known high voltage being independent of the input analog signal charge.

25. The method of claim 24 additionally comprising:
closing a switch connected between the input of the source follower buffer circuit and a known voltage reference; and closing a switch connected between the output of the source follower buffer circuits and another known voltage reference.

26. The method of claim 24 wherein the ADC stage output signals comprise a selected one of a single bit, one-and-one-half bits, or two bits.

27. The method of claim 24 wherein generating a redistribution charge comprises feeding the ADC stage output signals to a plurality of capacitors disposed in parallel.

* * * * *